United States Patent [19]

Ichikawa

[11] Patent Number: 5,427,055

[45] Date of Patent: Jun. 27, 1995

[54] METHOD FOR CONTROLLING ROUGHNESS ON SURFACE OF MONOCRYSTAL

[75] Inventor: Takeshi Ichikawa, Hachioji, Japan

[73] Assignee: Canon Kabushiki Kaisha, Tokyo, Japan

[21] Appl. No.: 9,733

[22] Filed: Jan. 27, 1993

[30] Foreign Application Priority Data

| Jan. 31, 1992 [JP] | Japan | 4-016525 |
| Jan. 31, 1992 [JP] | Japan | 4-041945 |
| Jan. 31, 1992 [JP] | Japan | 4-046163 |

[51] Int. Cl.$^6$ ............................................. C30B 23/08
[52] U.S. Cl. ........................................... 117/92; 117/913
[58] Field of Search .......... 156/601, 620.72, DIG. 64, 156/DIG. 73, DIG. 80, DIG. 102, DIG. 103; 437/11; 117/90, 92, 204, 913

[56] References Cited

U.S. PATENT DOCUMENTS 4,983,539  1/1991  Yamagawa et al. ................ 437/110

OTHER PUBLICATIONS

Journal of the Electrochemical Society, vol. 127, No. 2, (Feb. 1980) Takashi Unagami, "Formation Mechanism of Porous Silicon Layer by Anodization in HF Solution".
Journal of Electronic Materials, vol. 12, No. 6, (Nov. 1983), Hiroshi Takai et al., "Isolation Of silicon Film Grown On Porous Silicon Layer".
Solid State Devices and Materials, (Aug. 27-29, 1991), pp. 559-561, A. Ohkura et al., "The Optimization of In-Situ Thermal Cleaning Focused on Surface Microroughness for Future Si Epitaxial Growth".
Patent Abstracts of Japan, vol. 015, No. 484 (C-0892) (Dec. 9, 1991), and JP-A-32 08 887/(Matsushita Electric Industrial Co.) Sep. 12, 1991.
Journal of Electronic Materials, vol. 12, No. 6, 1983, pp. 973-982, H. Takai et al., pp. 974-975,pp. 978-979; FIGS. 1.4.
Thin Solid Films, vol. 106, No. 1/2, (Aug. 1983), pp. 3—136, Y. Ota, "Silicon Molecular Beam Epitaxy".
Journal of Vacuum Science and Technology: Part B., vol. 3, No. 2, (Mar. 1985), pp. 732-735, M. I. J. Beale et al., "A study of silicon MBE on porous silicon substrates".
Applied Physics Letters, vol. 48, No. 26, (Jun. 30, 1986), pp. 1793-1795, T. L. Line et al., "100 μm-wide silicon-on-insulator structures by Si molecular beam epitaxy growth on porous silicon".

*Primary Examiner*—R. Bruce Breneman
*Assistant Examiner*—Felisa Garrett
*Attorney, Agent, or Firm*—Fitzpatrick, Cella, Harper & Scinto

[57] ABSTRACT

A method for controlling roughness on a surface of a monocrystal comprises supplying atoms for deposition on the surface of the monocrystal having the roughness under irradiation with ions having controlled energy to carry out epitaxial growth, thereby reducing the roughness.

7 Claims, 3 Drawing Sheets

INCIDENT ION ENERGY DISTRIBUTION

METHOD FOR CONTROLLING ROUGHNESS ON SURFACE OF MONOCRYSTAL

BACKGROUND OF THE INVENTION

1. Field of the Invention

The present invention relates to a method for controlling roughness on the surface of a monocrystal inclusive of flattening the surface of the monocrystal, and more specifically, it relates to a method for controlling roughness on the surface of a semiconductor monocrystal suitable for electronic devices and integrated circuits.

2. Related Background Art

In order to meet requirements of speed up, high performance and high mechanism of devices, various researches and developments mainly such as miniaturization of semiconductors, have been made. Particularly, in recent years, much attention has been paid to researches about the surface state of substrates and grown films due to the development of atomic force microscopy, scanning tunneling microscopy and the like, making the influence of the surface state on the devices apparent. For example, with regard to problems of roughness on the surface of a semiconductor layer, it has been reported that the flatness on the surface of an Si monocrystalline layer affects the mobility of an MOS device [M. Miyashita et al., Extended Abstracts of the 179th Electrochemical Society Meeting, Washington, D.C., pp. 709–710 (1991)], and it also affects the insulating pressure resistance of an oxide film. These problems have a great influence on the scatter of the respective devices owing to the drop of a processing signal level with the miniaturization of a device size.

On the other hand, the researches about the surface state of the monocrystal are important for not only wafers but also porous layers. Particularly in recent years, these porous layers are expected for the realization of SOI structures [FIPO (Full Isolation by Porous Oxidized Silicon)]and for the application as Si light emitting elements, but needless to say, the surface state on the porous layers (inclusive of flatness, pore size and density) and the flatness on the surfaces of the monocrystalline layers deposited on the porous layers have a large influence on physical properties and the devices.

Heretofore, reports regarding the positive improvement of roughness (mainly micro roughness) on the surfaces of Si wafers are restricted, but nowadays, there has been reported that the removal of a spontaneous oxide film and the flattening of the Si surface can be achieved by a cleaning treatment using ultraviolet light excitation $F_2/H_2$ (Aoyama et al., the 51st Autumn Applied Physics 28a-D-8, and the 39th Spring Applied Physics 12a-B-6). However, this reported technique has some problems such as an insufficient flattening effect, the presence of RMS (Route Mean Square) of 0.6 nm or more, the employment of troublesome fluorine gas, and the occurrence of chemical reactions which gives rise to surface orientation dependence. In addition, there has been a report that a flattening degree by anneal at a high temperature (1,000° C.) in vacuo in an MBE apparatus was confirmed by an RHEED observation (Sakamoto et al., Electron Communication Society, Technical Report, SSD86-25), a report that in the case of high-temperature anneal in a nitrogen atmosphere, a temperature of 1,000° C. or more is necessary for flattening (Horiuchi et al., Electric Information Communication Society, SDM 91-194), and a report that a surface treatment prior to epitaxial growth is carried out at a temperature of 900° C. or more under reduced pressure in a hydrogen atmosphere (A. Ohkura et al., Extended Abstracts of the 1991 International Conference on SSDM (1991), pp. 559–561). These methods require high temperatures, and therefore applicable substrates are inconveniently limited. Moreover, it has also been reported that the generation of roughness can be inhibited by the irradiation of hydrogen plasma (Ishii et al., the 39th Spring Applied Physics 12a-B-1), but this technique has problems of damage by plasma and an insufficient control effect. It should be noted that these reports intend to prevent the enlargement of the micro roughness rather than to positively eliminate the micro roughness.

On the other hand, much attention is also paid to the control of roughness on a monocrystal surface in addition to the micro roughness, and for example, there is a problem regarding the control of roughness on the surfaces of porous layers. Prior to the description about porous layers, porous Si will be briefly explained. The porous Si has been discovered in the course of the research of electrolytic polishing of a semiconductor in 1956 by Uhlir et al. [A. Uhlir, Bell Syst. Tech. J., Vol. 35, p. 333 (1956)]. Furthermore, Unagami et al. have researched the dissolving reaction of Si in anodization, and they have reported that positive holes are necessary for the anodic reaction of Si in an HF solution [T. Unagami, J. Electrothem. Soc., Vol. 127, p. 476 (1980)]. According to observation through a transmission electron microscope, this porous Si has pores having a diameter of about 600 Å on the average, and the density of these pores is not more than half of that of monocrystal line Si. Nevertheles, the porous Si maintains monocrystal properties, and it is also possible to achieve the epitaxial growth of a monocrystalline Si layer on the porous layer (Unagami, J. Electrochem. Soc., Solid-state Science and Technology, pp. 1339). However, the crystallinity of the grown monocrystalline film is not perfect, and crystal defects are present. When it is attempted to improve the crystallinity by a high-temperature treatment or high-temperature film formation, characteristics of the porous Si sometimes alter, and so the properties themselves of the porous Si such as speeding up oxidation tend to change. In particular, when a temperature of 1,000° C. is used, the rearrangement of the pores in the porous Si occurs inconveniently. That is, it is not easy to grow, on the porous layer, the defects-free monocrystalline Si which is useful at the time of FIPOS formation, does not bring about the property change of the porous layer, and is excellent in flatness at a low temperature. For example, when the epitaxially grown layer is formed, a layer containing many voids is inconveniently grown in the form of an intermediate step [H. Takai et al., J. of Electronic Materials, Vol. 12, p. 973 (1983)], and as described above, crystal defects are formed disadvantageously. On the other hand, although the density of monocrystalline Si is 2.33 g/cm³, the density of the above-mentioned porous Si layer can be changed to a value in the range of 1.1 to 0.6 g/cm³ by altering the concentration of an HF solution to 50–20%. However, for the formation of the porous layer, a wet treatment which is the anodization process is used, and the dependence of a substrate concentration is strong. Thus, many restrictions are present, and so it is difficult to precisely control the thickness of the porous layer, impurities therein and the diameter of the pores therein. For these reasons, many problems must be solved in order to form the desired porous layer. Hence, a growth process is desired which permits the epitaxial growth of a porous layer having pores on the porous layer, the growth of a monocrystalline layer having no pores thereon, and which can optionally control the porosity and the flatness of the porous layer. Particularly, if the above-mentioned problems can be overcome by a dry treatment instead of the wet treatment, the above-mentioned growth process is more preferable, because an adsorbent such as moisture in the porous layer can be excluded.

SUMMARY OF THE INVENTION

An object of the present invention is to provide a method for controlling roughness on the surface of a semiconductor monocrystal to solve the above-mentioned problems and to meet the above-mentioned requirements.

Another object of the present invention is to provide a method for controlling roughness on the surface of a monocrystal, while the energy of ions with which the surface of the monocrystal is irradiated is controlled.

Still another object of the present invention is to provide a method for controlling roughness on the surface of a monocrystal which is characterized by depositing atoms on the surface of the monocrystal having the roughness to carry out epitaxial growth, while the surface is irradiated with ions having controlled energy, whereby the roughness is reduced.

DETAILED DESCRIPTION OF THE PREFERRED EMBODIMENTS

A method for controlling roughness on the surface of a monocrystal according to the present invention is characterized by supplying atoms for deposition (hereinafter referred to as "depositing atoms") on the surface of the monocrystal having the roughness under irradiation with ions having controlled energy to carry out epitaxial growth, thereby reducing the roughness.

The conception of the above-mentioned method includes the following methods:

A method in which the monocrystal is porous Si.

A method for controlling roughness on the surface of a monocrystal which comprises controlling the temperature of a substrate and the energy of ions to flatten the surface of a porous layer by the growth.

A method in which the temperature of a substrate and the energy of ions are controlled to grow a porous monocrystalline epitaxial layer having pores.

A method in which the monocrystal is an Si monocrystalline wafer.

According to the above-mentioned constitution, it is possible to optionally control the surface state and the physical properties of the monocrystalline layer having recesses. Examples of the monocrystal include monocrystals of Si, GaAs, Ge, SiC, SiGe and $Al_2O_3$, where are not restrictive. They are particularly effective for the surfaces of the monocrystals having fine recesses such as substrates and porous Si having micro roughness.

Embodiment 1

An embodiment in which the present invention is applied to a porous layer will be described in detail.

Figure 1A:
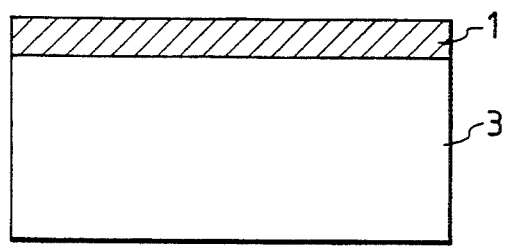
FIGS. 1A and 1B are schematic views illustrating one embodiment of a method according to the present invention.
Figure 1B:
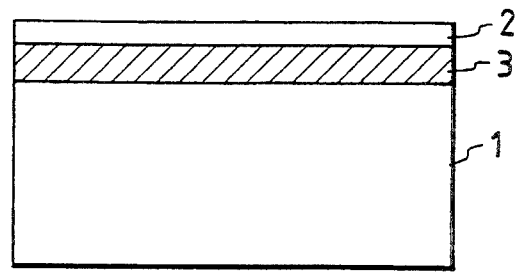

In the first place, as shown in FIGS. 1A and 1B, an Si monocrystalline substrate 1 is prepared, and all or a part of its surface is made porous. This formation of the porous Si substrate can be accomplished by the use of an anodization process using an HF solution. Next, the porous substrate 1 is placed in an apparatus which permits supplying depositing atoms on the surface of the substrate 1 under the control of a substrate temperature and simultaneously under the control of the energy of ions with which the surface of the substrate is irradiated.

Here, reference will be made to a sputter device usable in the present invention which permits supplying depositing atoms on the surface of the substrate under the control of a substrate temperature and simultaneously under the control of the energy of ions with which the surface of the substrate is irradiated.

Figure 2:
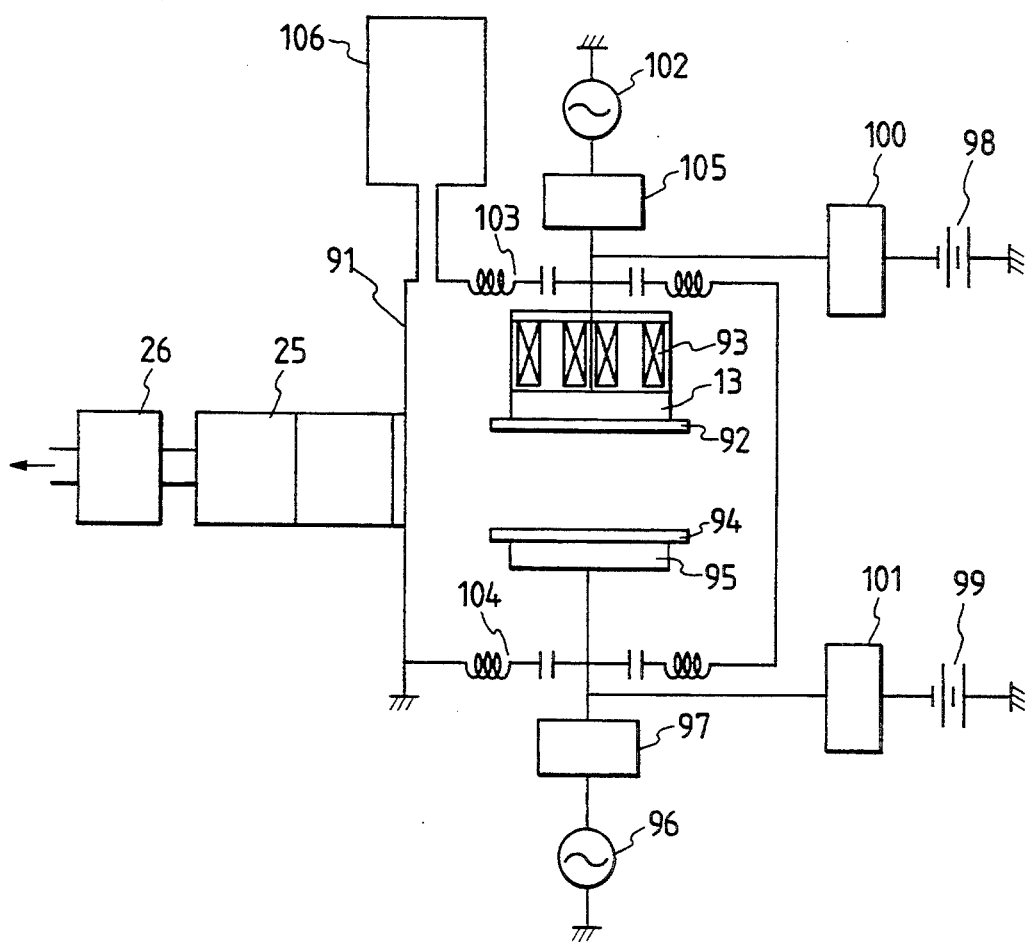
FIG. 2 is a schematic view illustrating one embodiment of a sputter device which is used in the practice of the present invention.

FIG. 2 shows one embodiment of the sputter device which can be used in the practice of the present invention. This device is a two-frequency excitation type bias sputter device. In FIG. 2, reference numeral 91 is a vacuum chamber, numeral 92 is a target, 93 is a permanent magnet, and 94 is a substrate. Furthermore, numeral 95 is a substrate supporting base, 96 and 102 are high frequency power sources, 97 and 105 are matching circuits, 98 is a DC power source for determining the DC potential of the target, and 99 is a DC power source for determining the DC potential of the substrate. Numerals 100 and 101 are low-pass filters of the target and the substrate, respectively, and 103 and 104 are band-pass filters thereof, respectively.

The vacuum chamber 91 is made of SUS 316, and the inside surface of the chamber is subjected to a surface treatment such as electrolytic polishing or electrolytic composite polishing to possess a mirror-polished surface having a flatness degree of Rmax<0.1 μm and having a passive state oxide film formed thereon with high-purity oxygen. Members of an exhaust system inclusive of a mass flow controller and a filter are all made of SUS 316 and subjected to electrolytic polishing and a passive state oxidation treatment so as to inhibit impurities from getting into the chamber to the utmost at the introduction of a gas. The exhaust system is constituted as follows: A main pump is a magnet float type and tandem type turbo molecular pump 25, and a dry pump 26 is used as an auxiliary pump. This exhaust system is an oil-free system and is constituted so as to inhibit contamination with impurities. The turbo pump in a second stage is a large flow rate type pump, and its exhaust rate can be maintained even at a vacuum degree of a mTorr order during the generation of plasma. The introduction of the substrate 94 into the vacuum chamber 91 is carried out through a load lock chamber (not shown) disposed adjacent to the chamber so as to inhibit the impurites from getting into the vacuum chamber 91. As a result of this constitution, impurities in Ar which is introduced into the chamber can be sufficiently inhibited, and even moisture present at the highest ratio, its amount is several ppb or less. Thus, when the temperature of the substrate is not raised, a background vacuum degree of $2 \times 10^{-11}$ Torr can be achieved. The target and the substrate are provided with variable high frequency power sources capable of giving hundreds MHz at maximum, and so the high-density plasma can be generated. In addition, the target and the substrate are provided with the DC power sources for applying the DC potential via the low-pass filters, whereby the potentials of the target and the substrate can be controlled. Therefore, film-forming conditions such as (a) a film-forming rate,
(b) the energy of Ar ions with which the substrate is irradiated, and
(c) a plasma density can be independently controlled.

Figure 4:
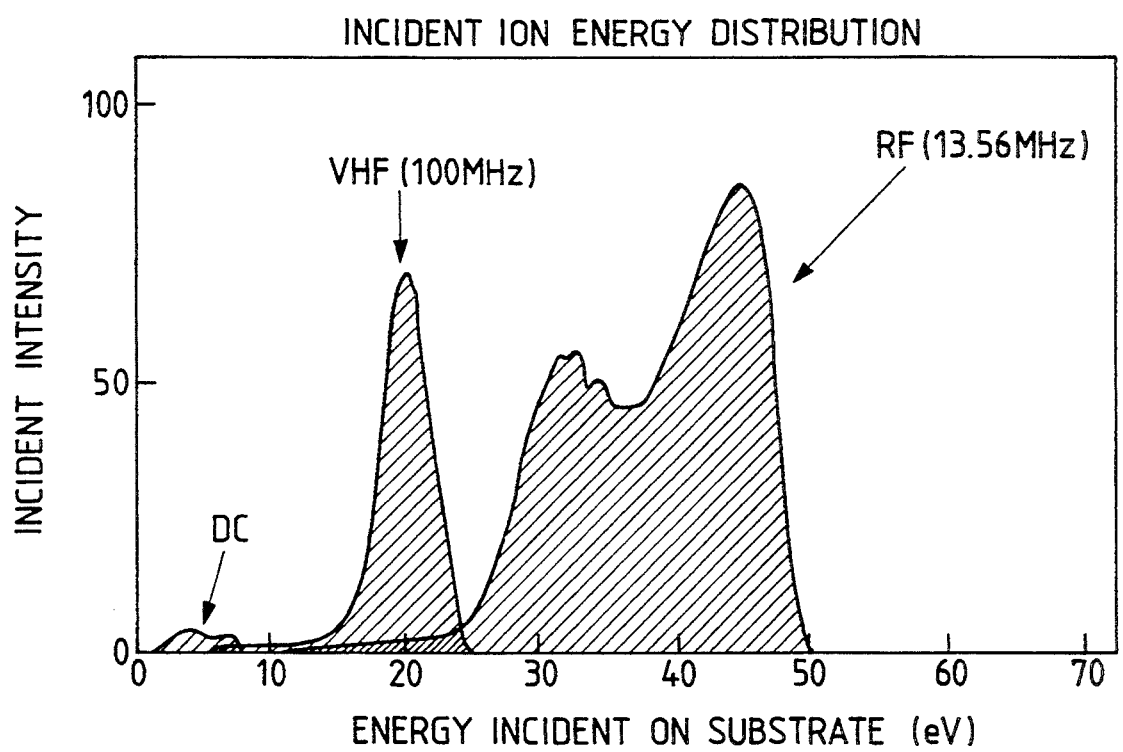
FIG. 4 is a graph showing a relation between energy incidnet on the substrate and incident intensity.

FIG. 4 shows the energy distribution of the ions with which the surface of the substrate is irradiated, and in this drawing, the frequency dependence of high frequency power to be applied to the target is elucidated. The higher the frequency is, the sharper the energy distribution is, and two peaks which appear in the case of the low frequency disappear, and one energy peak is distributed. The reason is that the higher the high frequency, the smaller the vibration of ions by the ratio frequency, that is, the smaller the energy to be absorbed by the ions. In consequence, when controllability is considered, the higher the frequency, the better. However, when the frequency is too high, its wavelength becomes equal to that of the substrate, so that in-plane distribution tends to occur. Therefore, the preferable frequency is in the range of 50 to 500 MHz.

Figure 5:
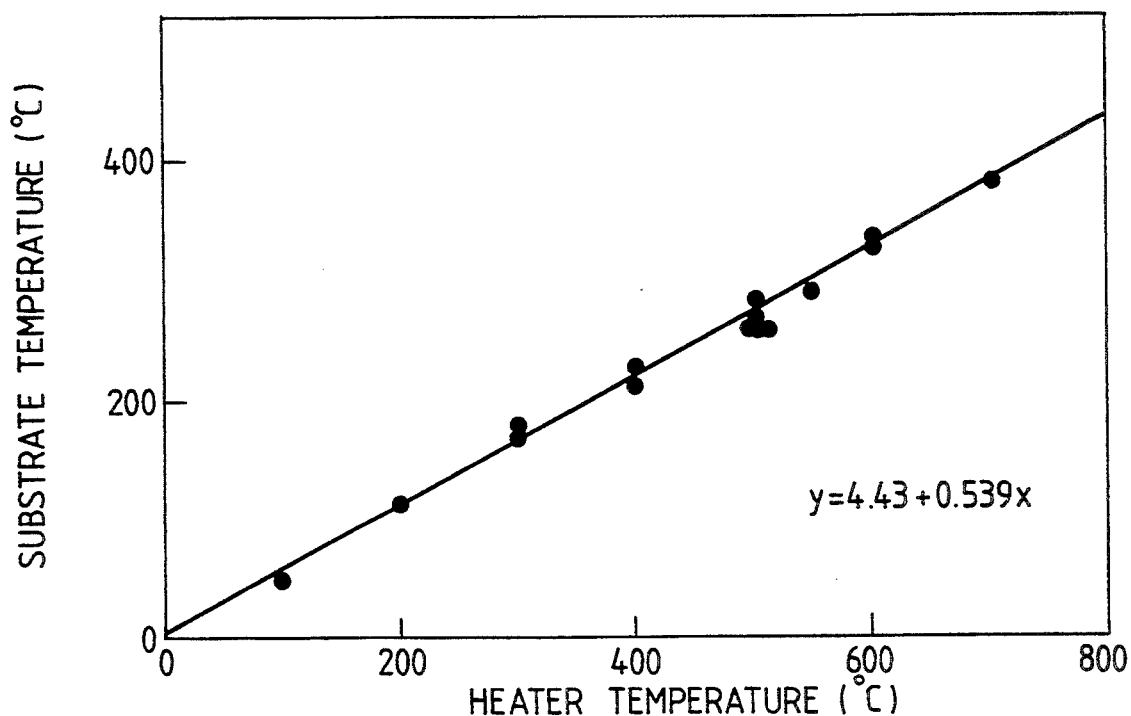
FIG. 5 is a graph showing a relation between the temperature of a heater and the temperature of the substrate.

The substrate is heated from the back surface of an electrostatic chuck which is the substrate supporting base by resistance heat of a kanthal heater. By the use of a PID (Proportion Integration Differentiation) controlling method, a thermocouple on the back surface of the substrate is controlled. FIG. 5 shows a relation between the temperature on the substrate surface and the temperature of the thermocouple on the back surface. The temperature control in the substrate surface can be carried out in a fluctuation range of ±1%. After the substrate is put on the electrostatic chuck, an equilibrium temperature is reached in about 30 minutes, and afterward, the fluctuation of the equilibrium temperature with time is in a range of ±0.5%. The reason why the control precision is excellent is that the electrostatic chuck having a small surface roughness is used as the substrate supporting base and heat energy is uniformly emitted from the surface of the electrostatic chuck. However, such a process is not limited, and a radiation heating means such as a lamp can also be used without any problem, so long as it is easily controllable.

Next, as shown in FIG. 1B, an epitaxial layer is formed on the surface of the porous substrate by the above-mentioned sputtering process, thereby obtaining a silicon monocrystalline layer 2.

Figure 3:
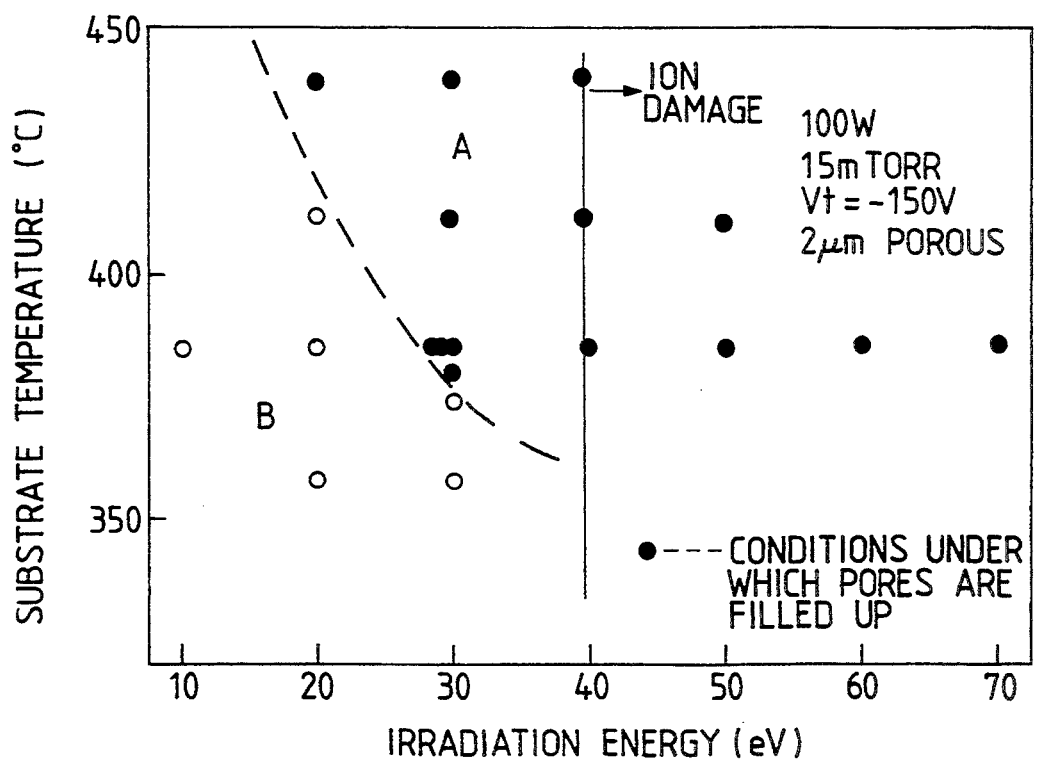
FIG. 3 is a graph showing a relation between irradiation energy and the temperature of a substrate.

In this case, when the energy value of the ions with which the porous surface is irradiated and the temperature of the substrate are precisely controlled, the monocrystalline Si film including no pores and having a good flatness or the monocrystalline porous layer having pores can be formed on the porous substrate without changing the characteristics of the underlying porous layer. As one example, films were grown changing the ion irradiation energy and the substrate temperature and using Ar of 15 mTorr as the introduction gas under a target DC potential of −150 V, an RF power of 100 W and a growth rate of 0.22 nm/sec., and crystallinities of the thus grown films are all shown in FIG. 3. When the irradiation energy is 40 eV or more under the above-mentioned conditions, this ion irradiation energy is too intensive, so that many defects are formed in the grown film. When the irradiation energy is 40 eV or less and the substrate temperature is set to a certain level, an Si menocrystalline film having no pores and a good flatness is obtained on the porous Si in a region A in FIG. 3. Furthermore, by changing the irradiation energy and the substrate temperature and altering the growth conditions toward a smaller energy level, the porous Si can be grown on the porous substrate and its properties can be regulated to desired values (a region B in FIG. 3). That is, by controlling the heat energy of the heated substrate and the energy of the ion irradiation, the Si film formed on the porous substrate can be optionally controlled in the range of from the monocrystalline film having a flat surface to the porous layer having the pores. Furthermore, since the dry deposition growth is employed, a p-n junction and a multi-layer structure can be obtained, and it is also possible to continuously control the porosity of the porous layer during the film formation by growth.

Embodiment 2

As a process for reducing micro roughness on an Si substrate, an embodiment using the present invention will be described in detail. In order to remove metal components, C and O from the surface of the Si substrate, it is a usual way to carry out acid wet washing in a semiconductor process, but such a washing manner increases the micro roughness in a ratio of a solution. The monocrystalline Si substrate (e.g., the substrate having Ra of 1.0 nm) having such a surface is placed in an apparatus which permits supplying depositing atoms on the substrate surface under the control of a substrate temperature and simultaneously under the control of the energy of ions with which the surface of the substrate is irradiated.

For example, Si epitaxial growth is carried out on the Si (100) monocrystalline substrate by the use of a bias sputter device, while the substrate is irradiated with Ar ions having an energy of 40 eV or less, and in this case, an Si epitaxial layer having a high flatness and a small micro roughness can be formed on the substrate. The substrate temperature is not less than a temperature at which the monocrystal growth proceeds (350° C. or more under the above-mentioned conditions), but it is preferably 700° C. or less in consideration of crystallinity. However, this temperature depends largely upon the structure of the apparatus (the influence of degassing and the like). These conditions are exemplary, and the irradiation energy and the substrate temperature depend upon a ratio γ between the number of the ions to be irradiated and the number of atoms for the film formation, pressure P, the substrate temperature, a substrate material and a film material, and it is necessary to optionally select optimum values. What is important is to precisely control the energy values so as to give the energy based on the ion irradiation and the heat energy of the heated substrate to the surface of the substrate without damaging the surface. No particular restriction is put on the ratio y and the pressure P, but preferably, the ratio γ is from about 0.1 to about 30, and the pressure P is from about 1 to about 50 mTorr capable of generating discharge.

Next, the present invention will be described in reference to typical examples.

Example 1

The surface of a p-type (100) monocrystalline Si substrate having a thickness of 525 μm was washed with a RCA wash liquid. The RCA wash liquid was composed of $NH_4OH:H_2O_2:H_2O = 1:1:5$, and the roughness on the surface was 0.6 nm in terms of Ra. The p-type (100) porous Si substrate was placed in a sputter device, and an Si epitaxial layer having a thickness of 0.1 μm was grown on the porous substrate at a low temperature by a bias sputter process (hereinafter abbreviated to "BS process"). Before the introduction of Ar, a vacuum degree in the sputter device was $1 \times 10^{-9}$ Torr. Conditions of deposition were as follows.

Surface cleaning conditions
 Temperature: 385° C.
 Atmosphere: Ar
 Pressure: 15 mTorr
 Substrate potential: 5 V
 Target potential: −5 V
 High frequency power: 5 W
 RF frequency: 100 MHz
Conditions of deposition
 RF frequency: 100 MHz
 High frequency power: 100 W
 Temperature: 385° C.
 Ar gas pressure: 15 mTorr
 Growth time: 10 minutes
 Film thickness: 0.1 μm
 Target DC current: −150 V
 Substrate DC potential: +20 V In this case, a plasma potential was measured by a probe method. As a result, it was 40 V, and in terms of irradiation energy, it was 20 eV. Furthermore, the surface of the grown Si film had an Ra (average roughness) value of 0.20 nm, which meant that the surface state was improved. According to section TEM observation through a transmission electron microscope and observation by secco etching, no defect was observed in this crystal. On the other hand, when the bias of the substrate was set to −10 V, the Ra value of the surface was 4.0 nm, which meant that the surface was rough, and crystal defects mainly such as lamination defects were also formed. The reason is that the energy of the irradiation ions was too intensive, so that the substrate and the deposited film were damaged.

Example 2

A p-type (100) monocrystalline Si substrate having a thickness of 525 μm was anodized in an HF solution. Conditions of the anodization were as follows.
 Current density: 5 mA·cm$^{-2}$
 Anodization solution: $HF:H_2O:C_2H_5OH = 1:1:1$
 Time: 2 minutes
 Thickness of porous Si: 2 μm
 Porosity: 40%

The p-type (100) porous Si substrate was placed in a sputter device, and an Si epitaxial layer having a thickness of 0.2 μm was grown on the porous substrate at a low temperature by a bias sputter process (hereinafter abbreviated to "BS process"). Before the introduction of Ar, a vacuum degree in the sputter device was $1 \times 10^{-9}$ Torr. Conditions of deposition were as follows.

Surface cleaning conditions
 Temperature: 385° C.
 Atmosphere: Ar
 Pressure: 15 mTorr
 Substrate potential: 5 V
 Target potential: −5 V
 High frequency power: 5 W
 RF frequency: 100 MHz
Conditions of deposition
 RF frequency: 100 MHz
 High frequency power: 100 W
 Temperature: 385° C.
 Ar gas pressure: 15 mTorr
 Growth time: 15 minutes
 Film thickness: 0.2 μm
 Target DC current: −150 V
 Substrate DC potential: −10 to +30 V In this case, a plasma potential was measured by a probe method. As a result, it was 40 V, and in terms of irradiation energy, it changed from 10 eV to 50 eV.

TABLE 1

| Irradiation Energy | Crystallinity |
| --- | --- |
| 10 eV | Porous |
| 20 eV | Porous |
| 30 eV | Flat monocrystal without pores |
| 40 eV | Flat monocrystal without pores (some defects were present) |
| 50 eV | Monocrystal with many defects |

Table 1 shows relations between the energy values of the irradiated ions and crystallinities obtained from RHEED images of the formed Si films. When the energy value of the irradiated ions was 20 eV or less, spots slightly appeared on the RHEED image as in the pattern of a porous surface. At this time, according to observation by Scanning Electron Microscopy (SEM), it was apparent that a porous layer was grown on the porous substrate. Furthermore, when the energy value at a peak in an energy distribution of the irradiated ions was more than 20 eV, an Si monocrystalline film having pores filled up could be grown. It was confirmed by section TEM observation through a transmission electron microscope and secco etching that this film had a monocrystal structure. In addition, the properties of the porous layer were not confirmed at this substrate temperature. The surface state of an epitaxial film irradiated with 30 eV was observed by AFM (atomic force microscopy), and as a result, a Pa value was 0.20 nm and a pv (peak to valley) value was 16 Å, which meant that the surface of the epitaxial film was so flat as to be comparable to that of a bulk Si wafer. On the other hand, when the energy value at the peak in the energy distribution of the irradiated ions was in excess of 50 eV, a Kikuchi line disappeared from the RHEED pattern, which meant that crystallinity largely deteriorated.

Example 3

A p-type (100) monocrystalline Si substrate having a thickness of 525 μm was anodized in an HF solution. Conditions of the anodization were as follows.
 Current density: 5 mA·cm$^{-2}$
 Anodization solution: $HF:H_2O:C_2H_5OH = 1:1:1$ Time: 2 minutes
Thickness of porous Si: 2 μm
Porosity: 40%

The p-type (100) porous Si substrate was placed in a sputter device, and an SiGe epitaxial layer having a thickness of 0.2 μm was grown on the porous substrate at a low temperature by a bias sputter process (hereinafter abbreviated to "BS process"). Before the introduction of a mixed gas of Ar and Xe, a vacuum degree in the sputter device was $1 \times 10^{-9}$ Torr. Conditions of deposition were as follows.

Surface cleaning conditions
    Temperature: 400° C.
    Atmosphere: Ar:Xe=1:1
    Pressure: 15 mTorr
    Substrate potential: 4 V
    Target potential: −5 V
    High frequency power: 5 W
    RF frequency: 100 MHz
Conditions of deposition
    RF frequency: 100 MHz
    High frequency power: 100 W
    Temperature: 400° C.
    Atmosphere: Ar:Xe=1:1
    Gas pressure: 15 mTorr
    Growth time: 12 minutes
    Film thickness: 0.2 μm
    Target DC current: −150 V
    Substrate DC potential: +5 V In this case, a plasma potential was measured by a probe method. As a result, it was 37 V, and in terms of irradiation energy, it was 32 eV.

In this case, the SiGe monocrystalline film having pores filled up could be grown on the porous Si. The change of properties of the porous layer was not confirmed. A Pa value was 3.0 nm, which meant that flatness was good.

Example 4

A silicon nitride (Si₃N₄) film having 500 Å was deposited on a p-type (100) monocrystalline Si substrate having a thickness of 525 μm, and a resist was then applied thereonto. After a patterning step, the ion implantation of boron was carried out to partially form a p+ region. Afterward, the ion implantation of hydrogen was done through the Si₃N₄ film to partially form an n region. Thus, the portion of the surface other than the n region was the p+ region. Next, the resist and the silicon nitride film were peeled, and anodization was then carried out in an HF solution to make the pt region only porous.

Conditions of the anodization were as follows.
    Current density: 5 mA·cm⁻²
    Anodization solution: HF:H₂O:C₂H₅OH=1:1:1
    Time: 2 minutes
    Thickness of porous Si: 2 μm
    Porosity: 40%

In this case, a porous layer was partially formed on the 4-inch Si substrate. This Si substrate was placed in a sputter device, and an Si epitaxial layer having a thickness of 0.2 μm was grown on the porous substrate at a low temperature by a bias sputter process (hereinafter abbreviated to "BS process"). Before the introduction of Ar, a vacuum degree in the sputter device was $5 \times 10^{-9}$ Torr. Conditions of deposition were as follows.

Surface cleaning conditions
    Temperature: 439° C.
    Atmosphere: Ar
    Pressure: 15 mTorr
    Substrate potential: 5 V
    Target potential: −5 V
    High frequency power: 5 W
    RF frequency: 100 MHz
Conditions of deposition
    RF frequency: 200 MHz
    High frequency power: 100 W
    Temperature: 439° C.
    Ar gas pressure: 15 mTorr
    Growth time: 20 minutes
    Film thickness: 0.2 μm
    Target DC current: −150 V
    Substrate DC potential: +20 V In this case, a plasma potential was measured by a probe method. As a result, it was 40 V, and in terms of irradiation energy, it was 20 eV. In this case, an Si monocrystalline film having closed voids could be grown on the porous substrate, and the monocrystalline Si was similarly grown even on a bulk which was not porous. According to section TEM observation through a transmission electron microscope and observation by secco etching, any defect was not observed in this crystal. An Ra value was 0.16 nm on the bulk and 0.22 nm on the porous layer, which meant that flatness was good.

Example 5

A p-type (100) monocrystalline Si substrate having a thickness of 525 μm was anodized in an HF solution.

Conditions of the anodization were as follows.
    Current density: 5 mA·cm⁻²
    Anodization solution: HF:H₂O:C₂H₅OH=1:1:1
    Time: 2 minutes
    Thickness of porous Si: 2 μm±0.05 μm
    Porosity: 40%

The p-type (100) porous Si substrate was placed in a sputter device, and an Si epitaxial layer having a thickness of 0.2 μm was grown on the porous substrate at a low temperature by a BS process. Before the introduction of Ar, a vacuum degree in the sputter device was $3 \times 10^{-10}$ Torr. Conditions of deposition were as follows.

Surface cleaning conditions
    Temperature: 385° C.
    Atmosphere: Ar
    Pressure: 15 mTorr
    Substrate potential: 5 V
    Target potential: −5 V
    High frequency power: 5 W
    RF frequency: 100 MHz
Conditions of deposition
    RF frequency: 100 MHz
    High frequency power: 100 W
    Temperature: 385° C.
    Ar gas pressure: 15 mTorr
    Growth time: 75 minutes
    Film thickness: 1 μm
    Target DC current: −150 V
    Substrate DC potential: 25 V In this case, a plasma potential was measured by a probe method. As a result, it was 40 V, and in term of irradiation energy, it was 15 eV.

Figure 6A:
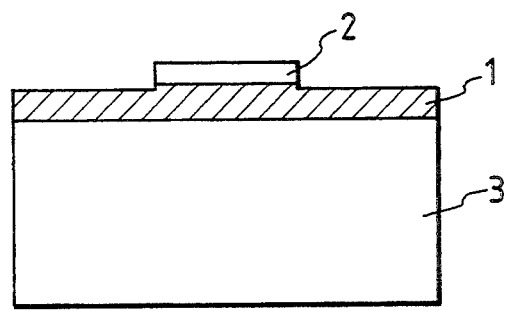
FIGS. 6A and 6B are schematic views illustrating an SOI structure.
Figure 6B:
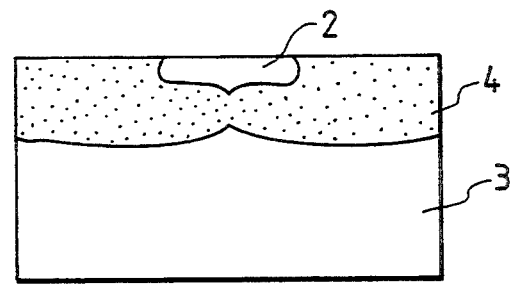

In this case, a porous monocrystalline Si could be grown on the porous layer, and a film thickness distribution was 2 μm±0.1 μm, which meant that scatter was remarkably improved to ±8.3% from ±25% which was a scatter value on a porous layer formed by anodization. The crystallinity of the porous monocrystalline film on the porous layer was confirmed from section TEM observation through a transmission electron microscope and observation by Secco etching. The change of properties of the porous layer was not confirmed at this substrate temperature. Next, a monocrystalline Si layer having 0.2 μm was deposited by an MBE (Molecular Beam Epitaxy) method. Conditions of the deposition were as follow.
   Temperature: 800° C.
   Pressure: 1E-9 Torr
   Growth time: 35 minutes Furthermore, patterning was then carried out by a lithography technique which could be used in a usual semiconductor process, to partially expose the porous layer [FIG. 6A], and the exposed porous layer was then oxidized by wet oxidation at 1,000° C., whereby an SOI structure having a thickness of 2,000 Å could be obtained [FIG. 6B].

Example 6

A p-type (100) monocrystalline Si substrate having a thickness of 525 μm was anodized in an HF solution.
   Conditions of the anodization were as follows.
      Current density: 5 mA·cm$^{-2}$
      Anodization solution: HF:H$_2$O:C$_2$H$_5$OH=1:1:1
      Time: 2 minutes
      Thickness of porous Si: 2 μm
      Porosity: 40%

The p-type (100) porous Si substrate was placed in a sputter device, and an SiGe epitaxial layer having a thickness of 0.2 μm was grown on the porous substrate at a low temperature by a BS process. Before the introduction of a mixed gas of Ar and Xe, a vacuum degree in the sputter device was $1 \times 10^{-9}$ Torr. Conditions of deposition were as follows.
   Surface cleaning conditions
      Temperature: 400° C.
      Atmosphere: Ar:Xe=1:1
      Pressure: 15 mTorr
      Substrate potential: 4 V
      Target potential: −5 V
      High frequency power: 5 W
      RF frequency: 100 MHz
   Conditions of deposition
      RF frequency: 100 MHz
      High frequency power: 100 W
      Temperature: 400° C.
      Atmosphere: Ar:Xe=1:1
      Gas pressure: 15 mTorr
      Growth time: 12 minutes
      Film thickness: 0.2 μm
      Target DC current: −150 V
      Substrate DC potential: +20 V In this case, a plasma potential was measured by a probe method. As a result, it was 37 V, and in term of irradiation energy, it was 17 eV.

In this case, the SiGe monocrystalline porous film succeeding the underlying porous layer could be grown on the porous Si. The change of properties of the porous layer was not confirmed.

Example 7

A p$^+$-type (100) monocrystalline Si substrate having a thickness of 525 μm was anodized in an HF solution.
   Conditions of the anodization were as follows.
      Current density: 5 mA·cm$^2$
      Anodization solution: HF:H$_2$O:C$_2$H$_5$OH=1:1:1
      Time: 2 minutes
      Thickness of porous Si: 2 μm
      Porosity: 40%

The p$^+$-type (100) porous Si substrate was placed in a sputter device, and an n$^+$ porous Si epitaxial layer having a thickness of 0.1 μm was grown on the porous substrate at a low temperature by a BS process. Furthermore, the target material was replaced with a p$^+$ substrate, and a porous Si epitaxial layer having 0.1 μm was grown at a low temperature to form a porous p$^+$n$^+$p$^+$ structure. Before the introduction of Ar, a vacuum degree in the sputter device was 4E-9 Torr. Conditions of deposition were as follows.
   Surface cleaning conditions
      Temperature: 439° C.
      Atmosphere: Ar
      Pressure: 15 mTorr
      Substrate potential: 5 V
      Target potential: −5 V
      High frequency power: 5 W
      RF frequency: 100 MHz
   Conditions of deposition
      RF frequency: 100 MHz
      High frequency power: 100 W
      Temperature: 439° C.
      Ar gas pressure: 15 mTorr
      Growth time: 7.5 minutes
      Film thickness: 0.1 μm×2
      Target DC current: −150 V
      Substrate DC potential: 20 V In this case, a plasma potential was measured by a probe method. As a result, it was 40 V, and in terms of irradiation energy, it was 20 eV. In this case, an Si monocrystalline porous film having a p-n junction and succeeding the underlying porous layer could be grown on the porous substrate. Furthermore, the multilayer monocrystalline Si was similarly grown even on a bulk which was not porous. According to section TEM observation through a transmission electron microscope and observation by secco etching, no crystal defect was observed.

Example 8

A p$^+$-type (100) monocrystalline Si substrate having a thickness of 525 μm was anodized in an HF solution.
   Conditions of the anodization were as follows.
      Current density: 5 mA·cm$^{-2}$
      Anodization solution: HF:H$_2$O:C$_2$H$_5$OH=1:1:1
      Time: 2 minutes
      Thickness of porous Si: 2 μm
      Porosity: 40%

The p$^+$-type (100) porous Si substrate was placed in a sputter device, and an n$^+$ porous Si epitaxial layer having a thickness of 0.1 μm was grown on the porous substrate at a low temperature by a BS process. Before the introduction of Ar, a vacuum degree in the sputter device was 1E-9 Torr. Conditions of deposition were as follows.
   Surface cleaning conditions
      Temperature: 385° C.
      Atmosphere: Ar
      Pressure: 15 mTorr
      Substrate potential: 5 V
      Target potential: −5 V
      High frequency power: 5 W
      RF frequency: 100 MHz
   Conditions of deposition RF frequency: 100 MHz
High frequency power: 100 W
Temperature: 385° C.
Ar gas pressure: 15 mTorr
Growth time: 16 minutes
Film thickness: 1 μm
Target DC current: −400 V
Substrate DC potential: 20→12 V
(pressure drop at 1 V/2 minutes)

In this case, a plasma potential was measured by a probe method. As a result, it was 30 V, and in terms of irradiation energy, it was gradually increased from 10 eV to 18 eV. In this case, migration in the surface of the layer increased with the gradual increase of the irradiation energy, so that the porosity of the grown porous monocrystalline film gradually decreased, and finally it became 10%.

According to section TEM observation through a transmission electron microscope and observation by secco etching, it was confirmed that the multi-layer porous monocrystalline film was formed on the porous layer, while the porosity of the monocrystalline film gradually was changing. The change of properties of the porous layer was not confirmed at this substrate temperature.

Example 9

A p$^+$-type (100) monocrystalline Si substrate having a thickness of 525 μm was anodized in an HF solution.
Conditions of the anodization were as follows.
  Current density: 5 mA·cm$^{-2}$
  Anodization solution: HF:H$_2$O:C$_2$H$_5$OH=1:1:1
  Time: 2 minutes
  Thickness of porous Si: 2 μm
  Porosity: 40%

The p$^+$-type (100) porous Si substrate was placed in a sputter device, and an n$^+$ porous Si epitaxial layer having a thickness of 1 μm was grown on the porous substrate at a low temperature by a BS process. Before the introduction of Ar, a vacuum degree in the sputter device was 1E-9 Torr. Conditions of deposition were as follows.
  Surface cleaning conditions
    Temperature: 385° C.
    Atmosphere: Ar
    Pressure: 15 mTorr
    Substrate potential: 5 V
    Target potential: −5 V
    High frequency power: 5 W
    RF frequency: 100 MHz
  Conditions of deposition
    RF frequency: 100 MHz
    High frequency power: 100 W
    Temperature: 385° C.
    Ar gas pressure: 15 mTorr
    Growth time: 24 minutes (8 minutes×3)
    Film thickness: 15 nm (5 nm×3)
    Target DC current: −50 V
    Substrate DC potential: 35, 32, 29 V In this case, a plasma potential was measured by a probe method. As a result, it was 45 V, and in terms of irradiation energy, it was stepwise increased from 10 eV to 16 eV. In this case, the irradiation energy changed every each layer and migration in the surface of the layer also changed, so that the respective grown porous monocrystalline films had different porosities. According to section TEM observation through a transmission electron microscope and observation by Secco etching, it was confirmed that the multi-layer was monocrystalline Si. The change of properties of the porous layer was not confirmed at this substrate temperature.

Example 10

A p-type (100) monocrystalline Si substrate having a thickness of 200 μm was anodized in an HF solution.
Conditions of the anodization were as follows.
  Applied voltage: 2.6 V
  Current density: 30 mA·cm$^{-2}$
  Anodization solution: HF:H$_2$O:C$_2$H$_5$OH=1:1:1
  Time: 1.6 minutes
  Thickness of porous Si: 200 μm
  Porosity: 56%

A high-quality epitaxial Si monocrystalline film having a thickness of 1 μm was deposited on the p-type (100) porous Si substrate by a usual CVD method.
Conditions of the deposition were as follows
  Source gas: SiH$_2$Cl$_2$ ... 500 sccm
  Carrier gas: H$_2$ ... 180 1/min.
  Substrate temperature: 950° C.
  Pressure: 80 Torr
  Growth time: 3 minutes Another Si substrate having one surface provided with an oxide layer having a thickness of 5,000 Å was superposed upon the surface of the above-mentioned epitaxial layer, and they were then heated at 600° C. for 0.5 hour to strongly bond both the Si substrates to each other.

Afterward, the bonded substrates were selectively etched with a mixed solution of 49% hydrofluoric acid, an alcohol and 30% hydrogen peroxide (10:6:50) without stirring. After 65 minutes, the porous Si substrate was selectively etched and completely removed, but the non-porous silicon monocrystalline layer only got rid of the etching and so it remained. In this case, the non-porous silicon monocrystalline layer was utilized as a material for etching stop. The etching velocity of the non-porous silicon monocrystalline layer with the etching solution was extremely low, and the depth of the etched layer was 50 Å or less even after 65 minutes. A selection ratio of this velocity to the etching velocity of the porous layer was as much as 10$^5$ or more, and therefore the amount (several tens Å) of the etched non-porous silicon monocrystalline layer was so small as to be practically negligible. That is, the Si substrate which had a thickness of 200 μm and which was made porous was removed, and a silicon monocrystalline layer having a thickness of 1 μm could be formed on SiO$_2$. Next, an Si epitaxial layer having a thickness of 0.1 μm was grown at a low temperature by a bias sputter process (hereinafter abbreviated to "BS process"). Conditions of deposition were as follows.
  Surface cleaning conditions
    Temperature: 450° C.
    Atmosphere: Ar
    Pressure: 15 mTorr
    Substrate RF frequency: 190 MHz
    Substrate high frequency power: 3 W
    Target potential: −5 V
    Target high frequency power: 5 W
    Target RF frequency: 100 MHz
  Conditions of deposition
    Target RF frequency: 100 MHz
    Target high frequency power: 100 W
    Temperature: 450° C.
    Ar gas pressure: 15 mTorr
    Growth time: 10 minutes Film thickness: 0.1 μm
Target DC current: −150 V
Substrate RF frequency: 190 MHz
Substrate high frequency power: 20 W Plasma potential was 39 V, and substrate surface potential was 19 V.

According to section observation through a transmission electron microscope, it was confirmed that an SOI structure having a good surface flatness and having a thickness of about 1.2 μm was formed in which any new defect was not observed in the Si layer formed by the CVD method and the Si layer formed by the BS method, and thus good crystallinity was maintained in these layers. The flatness of the surface was 3.0 nm in terms of an Ra value, which meant that the surface state was better then before the film formation by the BS method.

On the other hand, measured values of holes and other electrical characteristics of the grown layers were scarcely different from those of a usual bulk silicon.

Example 11

A p-type (100) monocrystalline Si substrate having a thickness of 200 μm was anodized in an HF solution. At this time, a current density was 100 mA/cm². Furthermore, a porous structure formation rate was 8.4 μm/min, and the p-type (100) Si substrate having a thickness of 200 μm was all made porous in 24 minutes. An epitaxial Si monocrystalline film having a thickness of 1 μm was deposited on the p-type (100) porous Si substrate by a usual CVD method. Conditions of the deposition were as follows.

Source gas: $SiH_2Cl_2$ ... 500 sccm
Carrier gas: $H_2$ ... 180 l/min.
Substrate temperature: 950° C.
Pressure: 80 Torr
Growth time: 3 minutes Next, an optically polished glass substrate of fuzed silica was superposed upon the surface of the above-mentioned epitaxial layer, and they were then heated at 600° C. for 0.5 hour to strongly bond both the Si substrates to each other.

Furthermore, an $Si_3N_4$ film having 0.1 μm was deposited thereon by a plasma CVD method so as to cover the two bonded substrates, and the nitride film only on the porous substrate was then removed by etching of reactive ions.

Afterward, the bonded substrates were selectively etched with a mixed solution of 49% hydrofluoric acid, an alcohol and 30% hydrogen peroxide (10:6:50) without stirring. After 65 minutes, the porous Si substrate was selectively etched and completely removed, but the non-porous silicon monocrystalline layer only got rid of the etching and so it remained. In this case, the non-porous silicon monocrystalline layer was utilized as a material for etching stop.

The etching velocity of the non-porous Si monocrystalline layer with the etching solution was extremely low, and the depth of the etched layer was 50 Å or less even after 65 minutes. A selection ratio of this velocity to the etching velocity of the porous layer was as much as $10^5$ or more, and therefore the amount (several tens Å) of the etched non-porous silicon monocrystalline layer was so small as to be practically negligible. That is, the Si substrate which had a thickness of 200 μm and which was made porous was removed and the $Si_3N_4$ film was removed, and a monocrystalline Si layer having a thickness of 1 μm could be formed on the fused silica glass substrate.

Furthermore, in the case that the $Si_3N_4$ film was replaced with Apiezon Wax or Electron Wax so as to cover the bonded substrates, a similar effect could be obtained, and the Si substrate only which was made porous could be completely removed.

Next, a non-porous monocrystal silicon epitaxial layer having a thickness of 0.2 μm was grown at a low temperature by a bias sputter process. Conditions of deposition were as follows.

Surface cleaning conditions
Target RF frequency: 100 MHz
Target high frequency power: 5 W
Temperature: 450° C.
Ar gas pressure: $15 \times 10^{-3}$ mTorr
Cleaning time: 5 minutes
Target DC bias: −5 V
Substrate RF frequency: 190 MHz
Substrate high frequency power: 3 W
Substrate DC bias: +5 V Conditions of deposition
Target RF frequency: 100 MHz
Target high frequency power: 100 W
Temperature: 450° C.
Ar gas pressure: $15 \times 10^{-3}$ mTorr
Growth time: 18 minutes
Film thickness: 0.2 μm
Substrate RF frequency: 190 MHz
Substrate high frequency power: 25 W
Target DC bias: −170 V Plasma potential was 41 V, and substrate surface potential was 21 V.

According to section observation through a transmission electron microscope, it was confirmed that an SOI structure having a good surface flatness and having a thickness of about 1.2 μm was formed in which any new defect was not observed in the Si layer formed by the CVD method and the Si layer formed by the BS method, and thus good crystallinity was maintained in these layers. The flatness of the surface was 2.7 nm in terms of an Ra value.

On the other hand, measured values of holes and other electrical characteristics of the layers were scarcely different from those of a usual bulk silicon.

As described above, according to the present invention, it is possible to control roughness on a surface of a monocrystal by supplying atoms for deposition on the surface of the monocrystal having the roughness under irradiation with ions having controlled energy to carry out epitaxial growth, thereby reducing the roughness. In this method, the surface temperature and the energy of the ions are controlled to achieve the epitaxial growth, so that the porous surface can be flattened. Furthermore, by controlling the surface temperature and the energy of the ions, a porous epitaxial layer having pores can be also grown on the porous surface. The above-mentioned method can be applied to the case that the monocrystal is an Si monocrystal wafer, and in this case, the surface of the wafer can be flattened to control micro roughness. According to the above-mentioned method, the surface state (flatness and the like) and physical properties of semiconductor monocrystalline layers having roughness can be optionally controlled.

What is claimed is:

1. A method for controlling roughness on a surface of a monocrystal comprising supplying atoms for deposition by a sputtering method on the surface of the monocrystal having the roughness under irradiation with ions having a controlled energy level of less than 50 eV to carry out epitaxial growth, thereby reducing the roughness.

2. The method for controlling roughness on the surface of a monocrystal according to claim 1 wherein said monocrystal is porous Si.

3. The method for controlling roughness on the surface of a monocrystal according to claim 2 wherein a flat monocrystalline layer having no voids is epitaxially grown by controlling a temperature of the substrate and the energy of the ions to be irradiated.

4. The method for controlling roughness on the surface of a monocrystal according to claim 2 wherein a porous epitaxial layer having voids is grown by controlling a temperature of the substrate and the energy of the ions to be irradiated.

5. The method for controlling roughness on the surface of a monocrystal according to claim 1 wherein said monocrystal is an Si monocrystalline wafer.

6. The method for controlling roughness on the surface of a monocrystal according to claim 1, wherein the sputtering method is carried out by use of a high frequency energy within the range of 50 to 500 MHz.

7. The method for controlling roughness on the surface of a monocrystal according to claim 6, where DC voltage is applied to a target which becomes a source for supplying the atoms.

* * * * *

UNITED STATES PATENT AND TRADEMARK OFFICE
CERTIFICATE OF CORRECTION

PATENT NO. : 5,427,055

DATED : June 27, 1995

INVENTOR : TAKESHI ICHIKAWA

It is certified that errors appear in the above-identified patent and that said Letters Patent is hereby corrected as shown below:

[57] Abstract

Line 2, "atomes" should read --atoms--.

DRAWINGS

Sheet 1, FIG. 1A, "1" should read --3-- and "3" should read --1--.

COLUMN 1

Line 16, "developments" should read --developments,--; and

Line 39, "Silicon)]and" should read --Silicon)] and--.

COLUMN 3

Line 42, "incidnet" should read --incident--.

COLUMN 4

Line 7, "where" should read --which--.

COLUMN 6

Line 12, "menocrystalline" should read --monocrystalline--; and

Line 68, "ratio y" should read --ratio $\gamma$--.

COLUMN 9

Line 50, "pt region" should read --$p^+$ region--.

UNITED STATES PATENT AND TRADEMARK OFFICE
CERTIFICATE OF CORRECTION

PATENT NO. : 5,427,055

DATED : June 27, 1995

INVENTOR : TAKESHI ICHIKAWA

It is certified that errors appear in the above-identified patent and that said Letters Patent is hereby corrected as shown below:

<u>COLUMN 10</u>

Line 24, "any" should read --no-- and "not" should be deleted; and

Line 63, "term" should read --terms--.

<u>COLUMN 11</u>

Line 57, "term" should read --terms--.

<u>COLUMN 14</u>

Line 40, "50 Åor" should read --50 Å or--.

<u>COLUMN 15</u>

Line 10, "any" should read --no--;

Line 11, "not" should be deleted;

Line 16, "then" should read --than--;

Line 36, "80 Tort" should read --80 Torr--; and

Line 38, "fuzed" should read --fused--.

UNITED STATES PATENT AND TRADEMARK OFFICE
CERTIFICATE OF CORRECTION

PATENT NO. : 5,427,055

DATED : June 27, 1995

INVENTOR : TAKESHI ICHIKAWA

It is certified that errors appear in the above-identified patent and that said Letters Patent is hereby corrected as shown below:

<u>COLUMN 16</u>

Line 37, "any" should read --no--; and

Line 38, "not" should be deleted.

Signed and Sealed this

Fourteenth Day of November, 1995

*Attest:*

BRUCE LEHMAN

*Attesting Officer*   *Commissioner of Patents and Trademarks*